(12) United States Patent
Pollack et al.

(10) Patent No.: US 12,115,654 B2
(45) Date of Patent: Oct. 15, 2024

(54) END EFFECTOR FOR SLAB FORMED SUBSTRATES

(71) Applicant: Atotech Deutschland GmbH, Berlin (DE)

(72) Inventors: Steffen Pollack, Berlin (DE); Siegfried Ickert, Berlin (DE)

(73) Assignee: Atotech Deutschland GmbH, Berlin (DE)

( * ) Notice: Subject to any disclaimer, the term of this patent is extended or adjusted under 35 U.S.C. 154(b) by 813 days.

(21) Appl. No.: 17/294,738

(22) PCT Filed: Nov. 22, 2019

(86) PCT No.: PCT/EP2019/082193
§ 371 (c)(1),
(2) Date: May 18, 2021

(87) PCT Pub. No.: WO2020/104639
PCT Pub. Date: May 28, 2020

(65) Prior Publication Data
US 2022/0016787 A1   Jan. 20, 2022

(30) Foreign Application Priority Data

Nov. 23, 2018  (EP) .................................. 18208030

(51) Int. Cl.
*B25J 15/00* (2006.01)
*B25J 11/00* (2006.01)
(52) U.S. Cl.
CPC ....... *B25J 15/0028* (2013.01); *B25J 15/0033* (2013.01); *B25J 11/0095* (2013.01)

(58) Field of Classification Search
CPC . B25J 15/0028; B25J 15/0033; B25J 11/0095
(Continued)

(56) References Cited

U.S. PATENT DOCUMENTS 8,556,318 B2 * 10/2013 Wu .................. H01L 21/68707
294/119.1
10,040,203 B2 * 8/2018 Ochiishi .................. B25J 9/123
(Continued)

FOREIGN PATENT DOCUMENTS

EP         1467399 A1     10/2004

OTHER PUBLICATIONS

PCT/EP2019/082193; PCT International Search Report and Written Opinion of the International Searching Authority dated Feb. 3, 2020.

*Primary Examiner* — Paul T Chin
(74) *Attorney, Agent, or Firm* — Renner, Otto, Boisselle & Sklar, LLP

(57) ABSTRACT

An end effector for clamping a slab formed substrate (2) having a rim section (5) that is arranged at least approximately and at least partially in a substrate main plane comprises at least a pressing device (10) providing at least a pressing area (11), and at least a support device (20) providing at least a support area (21). The end effector (1) is configured, in a clamped state of the substrate (2), to clamp the substrate (2) at a first surface (3) by a pressing area (11) of a pressing device (10) and at a second surface (4) that is, in regard to the first surface (3), arranged at the opposite side of the substrate (2) by a support area (21) of a support device (20). The end effector comprises a guide (15) for guiding the pressing device (10) relative to the support device (20).

24 Claims, 7 Drawing Sheets

(58) Field of Classification Search
USPC .............................................. 294/119.1, 213
See application file for complete search history.

(56) References Cited

U.S. PATENT DOCUMENTS

| | | | |
|---|---|---|---|
| 11,643,285 B1* | 5/2023 | Wei ........................ | B65G 47/90 |
| | | | 414/751.1 |
| 2009/0232631 A1 | 9/2009 | Zenpo et al. | |
| 2013/0051967 A1 | 2/2013 | Muramoto | |
| 2024/0025039 A1* | 1/2024 | Adelson ................ | B25J 9/1612 |

* cited by examiner

END EFFECTOR FOR SLAB FORMED SUBSTRATES

The present application is a U.S. National Stage Application based on and claiming benefit and priority under 35 U.S.C. § 371 of International Application No. PCT/EP2019/082193, filed 22 Nov. 2019, which in turn claims benefit of and priority to European Application No. 18208030.9 filed 23 Nov. 2018, the entirety of both of which is hereby incorporated herein by reference.

FIELD OF THE INVENTION

The present invention relates to an end effector for clamping a slab formed substrate having a rim section that is arranged at least approximately and at least partially in a substrate main plane, wherein the end effector comprises at least a pressing device providing at least a pressing area, and at least a support device providing at least a support area; and wherein the end effector is configured, in a clamped state of the substrate, to clamp the substrate at a first surface by a pressing area of a pressing device and at a second surface that is, in regard to the first surface, arranged at the opposite side of the substrate by a support area of a support device. Further, the invention concerns a gripping apparatus and method for clamping a substrate.

BACKGROUND OF THE INVENTION

In the state of the art, it is known to grip a substrate by end effectors using suction by vacuum, for example by use of one or more vacuum cups. This has the disadvantage that such a vacuum cup occupies a quite great part of the surface when used on the side where the substrate shall be treated. However, in many manufacturing processes, it is desirable to grip the substrate from the same side as it shall be treated. Additionally, forces in the suction area tend to deform thin substrates. Furthermore, it is not possible to grip the substrate at a narrow rim section only.

Another possibility is to use the Bernoulli effect in order to hold the substrate. However, this has also the disadvantage that a quite big holding area of the substrate must be reserved for flowing air against it, and, if the pressure difference is not identical at all places at the holding area, a deformation of the substrate results. Additionally, gripping a substrate by the Bernoulli effect occupies a great part of the substrate surface by the end effector. This is especially disadvantageous if the substrate is gripped at the side which shall be treated. Furthermore, in ultra clean applications such as semiconductor manufacturing, thoroughly purified air has to be used in order not to contaminate the clean environment. This renders this type of end effector expensive in such applications.

It is also known to use mechanical grippers as an end effector which can, for example, be driven by an element made of a shape memory alloy. However, such elements have the disadvantage to be comparably slow in reaction and to generate heat in operation and, correspondingly, consume comparably much energy. Finally, mechanical elements which interact by interlocking of their form can generate particles which can contaminate the clean environment.

Objective of the Present Invention

Object of the present invention is to provide an end effector which can be used in a clean environment, which does not occupy a great part of the surface of the substrate, which can be operated quickly and which handles the substrate without great deformation by the end effector.

SUMMARY OF THE INVENTION

Subject-matter of the present invention is an end effector which comprises a pressing device that is guided relative to a support device of the end effector by a guide. The end effector can thus clamp substrates of different thickness or a deformed substrate that has a rim section which has different positions in a direction of thickness of the substrate, at different places of the rim section, in other words, which is not even. In the clamping process, the movement of the end effector can take place relative to the substrate which changes the size of the opening between the pressing area and the support area of the end effector during a process of clamping the substrate. Such a movement can cause a movement of the guide. In this way, the pressing device can reach a position relative to the support device which is appropriate for clamping the substrate. Movements of the guide can compensate differences in direction of thickness such that a substrate can be clamped independently from its thickness or deformation. A deformation means a deviation from being straight or flat in case of even substrates.

Thus, the invention accordingly provides an end effector for clamping a slab formed substrate having a rim section that is arranged at least approximately and at least partially in a substrate main plane, wherein the end effector comprises at least a pressing device providing at least a pressing area, and at least a support device providing at least a support area; and wherein the end effector is configured, in a clamped state of the substrate, to clamp the substrate at a first surface by a pressing area of a pressing device and at a second surface that is, in regard to the first surface, arranged at the opposite side of the substrate by a support area of a support device. The pressing device comprises a guide for guiding the pressing device relative to the support device. The guide may be arranged to guide the pressing device relative to the support device such that the end effector is movable relative to the substrate during a process of clamping the substrate by the end effector.

The dependent claims concern embodiments of the invention.

Such an end effector can be used for clamping of substrates. The word "gripping" is used in this patent application in association with handling a substrate by a plurality of end effectors. A slab form means that a dimension of the substrate in one direction is significantly smaller than the dimensions in two directions that are perpendicular to the first one. The substrate is, in other words, a planar substrate.

Particularly, the first and the second surface of substrate have at least approximately this same direction as a substrate main plane. A substrate can be thin compared to its contour of the substrate main plane. For example, it can have a thickness of less than 5 mm, preferably less than 2.5 mm or even less than 1 mm. Preferably, it is pliable to a certain amount that is not detrimental to it. The substrate can have a round, particularly a circular shape or an angled contour shape, especially a rectangular shape, or an arbitrary contour shape with edges and connecting section that can be straight or curved. The substrate can, for example, be a printed circuit board or a printed circuit foil or a wafer.

Particularly, such end effectors can be used in chemically aggressive environments, preferably for handling a substrate which is to be plated. Alternatively or additionally, the environment can be a clean environment such as a clean room. For example, the substrate can be an object that is to be treated, especially electrochemically or chemically, or worked on in a manufacturing process of a semiconductor or a printed circuit board. For example, the treatment can be plating. The substrate can, for instance, be a wafer, preferably of silicon, of a size of more than 100 mm, preferably 150 mm, 200 mm, or 300 mm.

The possible or allowed travel of the guide may be at least 1 mm, more particularly at least 3 mm, e.g. at least 12 mm. Silicon wafers have relatively small deformations and differences in thickness such that 1 mm can be enough, and for a great part of cases, also with substrates of other materials, 3 mm is sufficient. For example, a substrate can be made of a plastic material, particularly a moulded compound material or a cured resin material, which may comprise a reinforcement material. This can, for example, be a printed circuit board. Particularly such a substrate can have quite large dimensions in the main plane, for example more than 200 mm. Therefore, it can have a greater deformation in direction of thickness. For example, 12 mm of allowed travel of the guide can be sufficient for clamping almost all printed circuit boards in common practice. However, for specific cases of clamping printed circuit boards, a travel of the guide of less than 12 mm can also be used, especially in dependency of typical thickness and deformation of the substrate.

In an embodiment, the guide comprises an elastic guide arranged to exert an elastic pressing force on the substrate during a relative movement of the guide. It is thus proposed that a pressing force on the substrate be exertable during a relative movement of the guide, particularly an elastic pressing force. The pressing force can particularly be generated by an elastic guide. The pressing force on the substrate is exerted at a pressing area on a surface of the substrate. The pressing force is preferably directed towards the substrate main plane. An advantage in comparison to non-pliable pressing devices is a comparably small pressing force that is exerted on the pressing areas at places where the substrate is deformed or thicker. The risk of damaging the substrate is thus smaller and the substrate is handled carefully. However, it is still possible to reduce deformation or to planarize the substrate by the pressing forces which can be higher at places at the rim section of the substrate at which the substrate is deformed in thickness direction and can press it towards even form of the substrate. Areas of the substrate which are deformed in thickness direction can be subject of stronger pressing force in case of an elastic pressing force. It is possible that, in a gripping apparatus which comprises a plurality of end effectors according to the invention, an end effector which is positioned at a place at with the substrate is deformed, does not clamp the substrate from both sides, but only exerts a pressing force onto one side of the substrate.

The elastic guide may be realized by a guide comprising springs as guiding elements. Particularly, these guiding elements may be elongated springs which may be arranged in parallel to each other. The direction of movement of the guide is preferably transverse to the elongated direction of the springs. This has the advantage that during elastic movement of the guide, only very little movement in direction of the elongated dimension of the spring is carried out at the same time. Metal strip springs or wire springs may be used as the elongated springs arranged in parallel to each other.

In an embodiment, the guide is movable in a direction that is at least partially, e.g. at least approximately, transverse to the substrate main plane.

The guide is thus arranged to guide the pressing device in a direction that is at least partially normal to the substrate main plane. The movement may be approximately normal to the substrate main plane. An a least approximately normal movement of the pressing device can be appropriate in order to touch the substrate for transfer of forces, but without significant rubbing over its surface which is disadvantageous, especially in a clean environment, as it can produce particles. Such rubbing can take place if the substrate is fixed in the direction of its main plane and the guide produces not only a movement guiding direction, but also a transverse movement that this normal to this movement. If the substrate is not fixed in direction of its main plane, it can be moved by the transverse movement in direction of the main plane of the substrate during clamping which can be disadvantageous if the substrate needs to have a certain position. However, a movement of the support device partially parallel to the substrate main plane means that a part of a movement goes in a direction normal to the substrate main plane and another part of the movement goes in the direction of the substrate main plane. A movement in a direction oblique to the substrate main plane results thereby. The main purpose of the guide can still be achieved by such a movement.

During clamping, the substrate can be supported by an auxiliary support which acts on other places of the second surface of the substrate than does the support device. The auxiliary support may be a device onto which the substrate can be arranged in order to be clamped by the end effector. For example, if the substrate is supported by an auxiliary support in an inner region of the second surface of the substrate, and the support area is at a rim section of the second surface of the substrate, pressing forces in an early stage of clamping can be exerted onto the first surface of the substrate and be transferred to the auxiliary support on the opposite side. The support device can still be inactive in this stage of clamping the substrate. For activating the support device, it can be positioned such that it is in a distance to or at a support area at the second side of the substrate. Preferably, the support area is arranged at least approximately at the same position as the pressing area, at the opposite side of the substrate.

In order to move the end effector relative to the auxiliary support, a positioning device can be provided. This can, for example, be a robot at which the end effector is attached. The positioning device can move the end effector relative to the auxiliary support until a predetermined relative position of the end effector to the auxiliary support is reached. If an elastic guide used, also a predetermined pressing force can be reached in the predetermined relative position. The guide of the pressing device guides the relative movement. Preferably, the predetermined relative position is such that the support area at the support device is arranged, in relation to the substrate, on the side of the second surface of the substrate.

Then, the support device can be moved from outside of the substrate behind the substrate, as seen from the side of the pressing device towards the substrate such that it comes into a gripping position. The support area at the support device may still be at a distance to the substrate in a normal direction to the second surface at that stage. Then, a movement of the support device parallel to the second surface is possible without touching the second surface of the substrate.

In a clamped state or during a part of the clamping process, the support area may be arranged inside an outline of the shape of the substrate in regard of the substrate main plane. This can be the result of moving the support device towards the substrate such that at least a part of the support device overlaps with the substrate, in a view towards the substrate main plane. In a released state of the substrate, the support device does not overlap with the substrate in a view towards the substrate main plane. In other words, in the released state, the support area of the support device is arranged outside the above-mentioned outline. During the alternation of the released state and the clamped state, the support area at the support device crosses the border of the substrate.

Thus, in an embodiment, the support device is movable in a direction parallel to the substrate main plane relative to the pressing device such that the support area of the support device is movable at least partially across a border of the substrate from outside of the substrate into a position behind the substrate, as seen from the side of the pressing device.

In an embodiment, the end effector comprises an actuator for moving the support device.

The actuator may be configured to move the support device in a direction parallel to the substrate main plane relative to the pressing device.

In an embodiment combining the three previous embodiments, the actuator is arranged to move the support device in the direction parallel to the substrate main plane, and the end effector comprises a claw-shaped part comprising a part extending perpendicularly to the substrate main plane and a part extending in parallel to the substrate main plane and connected to the part extending perpendicularly to the substrate main plane, wherein either the claw-shaped part comprises the actuator and the support device and the actuator is arranged to move the support device relative to the part extending perpendicularly to the substrate main plane or the support device comprises the claw-shaped part.

In an embodiment in which the end effector comprises an actuator for moving the support device, the actuator is arranged, in relation to the substrate and in the clamped state of the substrate, on the side of the first surface of the substrate.

In an embodiment in which the end effector comprises an actuator for moving the support device, the actuator comprises a vacuum cylinder.

In an example of this embodiment, the support device is movable away from the substrate by the effect of vacuum in the vacuum cylinder.

An embodiment of the end effector in which the end effector comprises an actuator for moving the support device further comprises a safety device by which the support device is movable in the direction parallel to the substrate main plane towards the substrate in case of failure of the actuator.

The support device may have multiple support areas that may have a distance to each other. The multiple support areas may be moved at the same time, e.g. by the same actuator or the same safety device. At least a part of the support areas may be arranged at least approximately in the same plane. In this way, an even or somewhat deformed substrate can be supported. An advantage of having multiple support areas is that a substrate can be supported at a wider area, but without completely occupying it by the support area. Then, more of the area of the substrate is available for treatment.

An embodiment of the end effector is configured to clamp a substrate having a thickness of 3 mm or less at a rim section of the substrate.

In this embodiment, the end effector uses a clamping zone at a rim section of the substrate. The rim section can have a width between the border of the substrate and the interior or the substrate of 3 mm, or less in case of a substrate made of a stiff and/or precisely manufactured material such as a silicon wafer or a comparable substrate. Alternatively, a clamping zone of 12 mm or less in case of a plastic material or another material which is not a silicon and which is less accurately manufactured or prone to deformation, such as a moulded plastic compound material. A small contact area has the advantage that only a small part of the substrate is occupied by the end effector and more of the area of the substrate can be treated.

In an embodiment, at least one support area and/or at least one pressing area has an elongated form, wherein the longitudinal direction of the support area and/or the pressing area, respectively, is, in a clamped state of the substrate, arranged at least approximately parallel to the rim of the substrate. By such an elongated support and/or pressing area, less forces per area are exerted on the substrate, and also the flattening effect of the end effector is increased. Preferably, a support area and a pressing area which are associated to each other, have at least approximately the same form. Then, no bending forces have to be borne by the substrate which means significant less load on the substrate.

As mentioned, the support device may be movable by an actuator. The movement may be parallel to the second surface of the substrate and thus to the substrate main plane. If the actuator is arranged, in relation to the substrate, at the side of the first surface of the substrate, the end effector can be a compact device. The support device may have a form such that a part of it, in the clamped state of the substrate, extends perpendicularly to the second surface of the substrate and a further part of it which is connected to the aforementioned part extends parallel to the second surface of the substrate. In this way, a kind of claw is formed which can engage with the substrate in the clamped state.

The support device may also be movable by a safety device. The purpose of the safety device is to make sure that a substrate is not dropped in case the actuator fails. In other words, the end effector is, preferably, normally closed and opens by action of the actuator. The safety device can move the support device towards the substrate in case the actuator is inactive. The counter-movement can be carried out by the actuator. The safety device can be a safety spring, for example.

The actuator may be a vacuum cylinder. A vacuum cylinder avoids blowing out particles like pneumatics, and does not attract ferromagnetic particles like magnetic actuator. The vacuum cylinder may be configured to move the support device away from the substrate by the effect of vacuum.

The material of at least one pressing area at the pressing device and/or at least one support area at the support device may be a fluoro-elastomer (FKM) or a perfluoro-elastomer (FFKM). An advantage is that these types of the elastomer have a low tendency to produce wear debris and are therefore adapted for use in a clean environment.

In another aspect of the invention, a gripping apparatus is proposed which comprises at least one end effector according to one of the above-mentioned embodiments. The at least one end effector may be held by an end effector holder, wherein the end effector holder is movable relative to the substrate, at least partially in a direction that is transverse to the substrate main plane. A transverse direction to the substrate main plane does not necessarily mean that this direction is perpendicular to the substrate main plane. It can also be oblique to a certain degree that still enables to grip the substrate properly.

An embodiment of the gripping apparatus is provided with an auxiliary support, wherein the gripping apparatus is configured to move the end effector relative to the substrate until a predetermined relative position of the end effector to the auxiliary support is reached.

The gripping apparatus may comprise an end effector holder that holds at least two end effectors which are arranged at least approximately at opposite sides of the substrate. The opposite sides are opposite sides seen looking onto the first or second surface. The substrate is preferably supported at two opposite sides in regard of its center of gravity. When it is gripped at opposite sides, it is possible to lift the substrate without exerting heavy bending load on the substrate at a gripping position. The end effector holder may hold at least three, e.g. four or more, for example six, end effectors which can grip the substrate from different directions. Gripping a substrate from different directions has the advantage that the substrate cannot fall out of the gripping apparatus as might happen when gripped only at opposite sides, due to form fit. The different directions are different directions parallel to the substrate main plane. In other words, the substrate is gripped at different locations along the circumference of the substrate. In an embodiment for holding a disc-shaped planar substrate, the at least three end effectors may be arranged in a plane corresponding to or parallel to the substrate main plane about a central axis such that each pair of neighbouring end effectors subtends an angle of less than 180° with respect to the central axis.

The gripping apparatus can comprise a multi axis robot or multi axis movement apparatus that can, for example, grip and transport the substrate from a first to a second location. The multi axis system carries out gripping, in that it firstly moves the end effectors towards the substrate until the support devices of the end effectors are in a position in which they can engage with the substrate. This can happen using an auxiliary support, onto which the substrate is pressed. The auxiliary support preferably does not support the substrate at a place at which a support devices is to engage with the substrate. Then, the gripping apparatus can engage the support devices. After this, the gripping apparatus can transport a gripped substrate.

It is possible to center a substrate relative to an end effector holder. Centering can take place between parts of the supported device which engage with the circumference of the substrate in the substrate main plane. Preferably, the engagement is soft in order to be kind to the substrate. It is, however, also possible to use hard engagement in order to have a proper relative positioning between the substrate and the end effector holder. For this purpose, one or more, preferably two, hard stops for the circumference of the substrate can be arranged at the end effector holder.

In a further aspect of the invention, a method is proposed, wherein at least one end effector according to one of the above-mentioned embodiments is used for clamping the substrate. According to the method, the end effector is moved towards the substrate, wherein the pressing device touches the substrate. The end effector is thus moved relative to the support device during the movement of the end effector towards the substrate.

In an embodiment, the movement of the end effector towards the substrate is carried out until a predetermined position is reached. In the predetermined position, the support area is arranged at the side of the second surface of the substrate. When the predetermined position is reached, the support area can be moved across the border of the substrate. This can be carried out by activating or, preferably, by deactivating an actuator. An actuator can return to a default position by being deactivated in which the support device is positioned inside the border. After moving the support area across the border of the substrate, the end effector can be moved away from the substrate until the support area touches the second surface of the substrate. Then, the substrate is clamped between the pressing area and support area.

In a released state of the end effector, forces can yet be exerted on the substrate. This is possible, because exerting the pressing force onto the first surface of the substrate is independent from supporting the substrate at the support area of the support device. Instead, during the clamping process, the substrate can be supported by an auxiliary support which acts onto other places of the second surface of the substrate. The auxiliary support is a device on which the substrate can lie in order to be gripped by the end effector. For example, if the substrate is supported by an auxiliary support in an inner region of the second surface of the substrate, and the support area is at a rim section of the second surface of the substrate, the pressing forces can be exerted onto the first surface of the substrate and be transferred to the auxiliary support on the opposite side of the substrate. After these forces are already in action, the support device can come into operation and take over the support at the support area. Then, the pressing force can be relieved from the auxiliary support by a movement of the end effector away from the auxiliary support. The pressing force is then borne by the support device. As the support device and the pressing device both are part of the end effector, the substrate is then connected to the end effector only. It can then be transported to another place, for example to a treatment station, particularly to a plating apparatus.

A gripping apparatus can comprise a plurality of end effectors which can be arranged at an end effector holder. The end effector holder can be positioned relative to the substrate in order to operate the plurality of end effectors at the same time in order to grip the substrate.

The end effector according to the invention may be configured to carry out a method according to the invention, as may be the gripping apparatus. The method may make use of the gripping apparatus according to the invention.

BRIEF DESCRIPTION OF DRAWINGS

The attached Figures show, as examples only, embodiments of the invention, wherein.

DETAILED DESCRIPTION OF EMBODIMENTS

Figure 1:
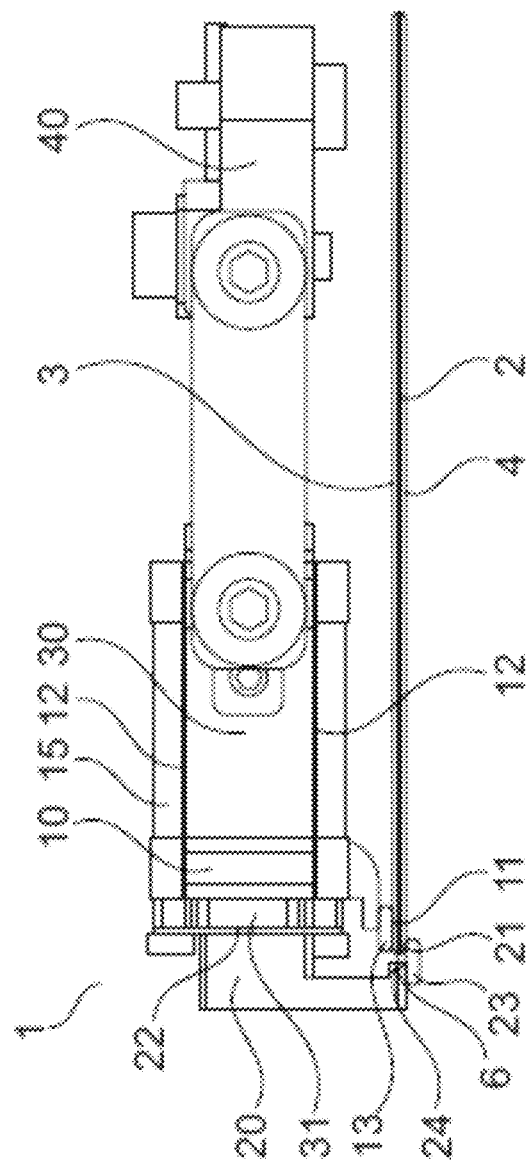
FIG. 1 shows a side view of a first embodiment of the end effector when clamping a substrate.

In FIG. 1, a first embodiment of an end effector 1 is shown in a clamped state in which the end effector 1 clamps a substrate 2 at its first surface 3 and its second surface 4. The end effector 1 comprises a pressing device 10, a support device 20, a guide 15 and a vacuum cylinder 30. A pressing contact element 13 is arranged at the pressing device 10. The pressing contact element 13 comprises a pressing area 11 which is directed towards the first surface 3 of the substrate 2. The support device 20 comprises a support contact element 23 which is arranged at a support protrusion 24. At the side of the support contact element 13 towards the substrate 2, a support area 21 is arranged. The substrate 2 is clamped between the pressing area 11 and the support area 21.

The pressing contact element 13 and/or the support contact element 23 can be a ring or a pad which is preferably made of an elastomer, most preferably of a fluoro-elastomer (FKM) or a perfluoro-elastomer (FFKM).

The pressing device 10 is guided by the guide 15. The guide 15 is movable in a direction normal to the first surface 3 and the second surface 4 of the substrate 2. The guide 15 comprises two parallel metal strip springs as guide springs 12. The guide springs 12 are arranged at least approximately parallel to the first surface 3 of the substrate 2. When the pressing area 11 is in contact with the first surface 3 of the substrate 2, this type of guide 15 enables a guiding movement of the pressing device 10 which is almost or completely free of rubbing over the first surface 3 of the substrate 2. Furthermore, no moving mechanical engagement between parts of the end effector 1 is present such that no debris is produced during a guiding movement. During a guiding movement away from the substrate 2, the guide 15 generates an elastic pressing force. In the clamped state of the substrate as shown, an elastic force is exerted on the substrate 2.

The vacuum cylinder 30 comprises a piston 31. The piston 31 carries the support device 20. A movement of the piston 31 can cause that the support contact element 23 across the border 6 of the substrate 2. FIG. 1 shows the piston 31 in the position in which the contact element 23 is engaged with the substrate 2. Using a vacuum cylinder has the advantage that only a low or no particle emission is caused, because air is sucked into the vacuum cylinder 30 and takes with it the debris that is produced by the movement of the piston 31.

The end effector 1 comprises a holder 40 which connects the aforementioned parts of the end effector 1 with a connection section 41 at which the end effector 1 can be connected, for instance to a handling device such as a robot.

Figure 2:
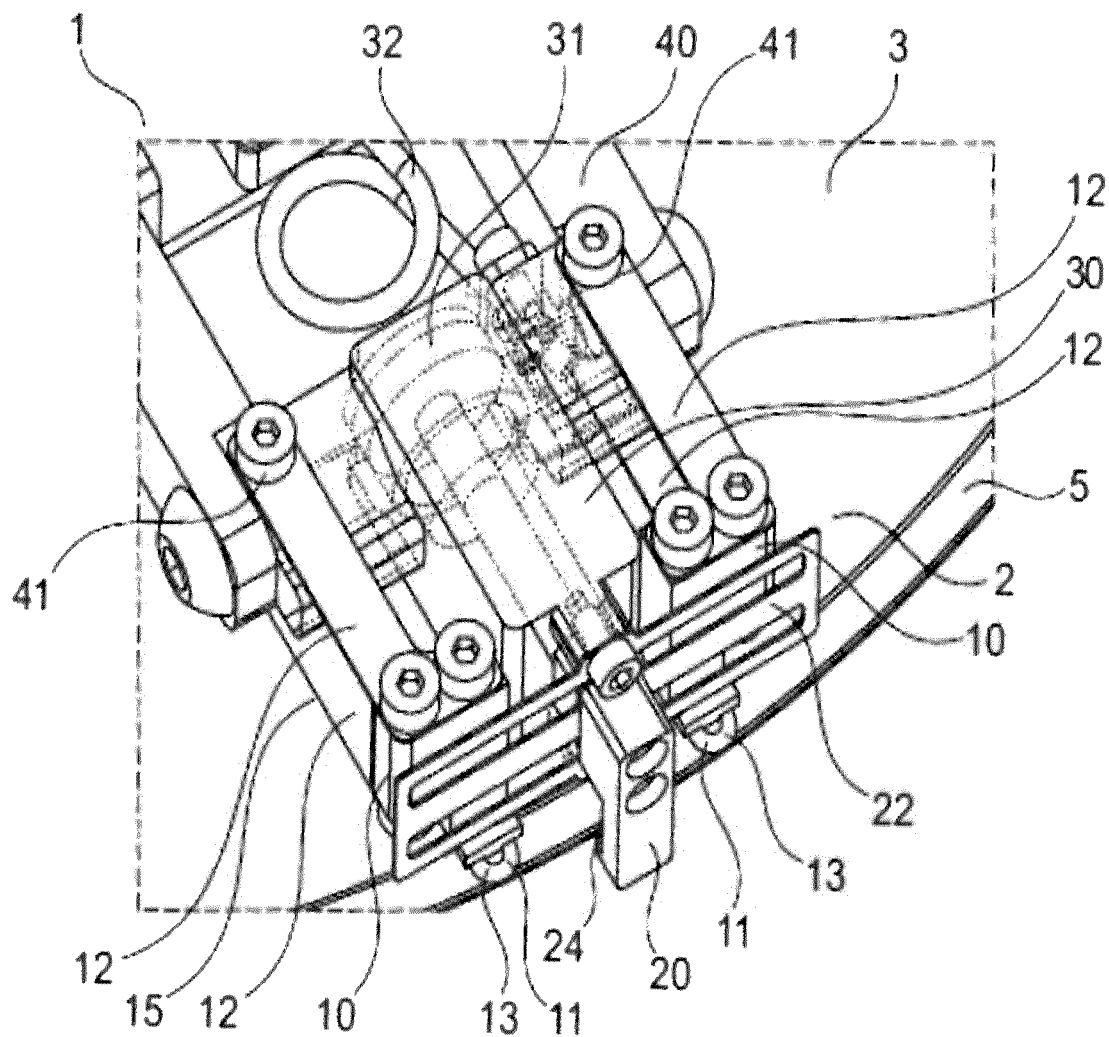
FIG. 2 shows a perspective view in an oblique direction to the upper side of the first embodiment of the end effector when clamping a substrate.

FIG. 2 shows a perspective view of the first embodiment of the end effector 1.

In FIG. 2, a safety device 22 is shown which has the form of a return spring. The safety device 22 is fastened to the support device 20 and also to the pressing device 10, wherein the connection is not shown in FIG. 2. The return spring is elastically pliable in direction of the movement of the piston 31. A movement of the support device 20 from a position in which the support area 21 is close to or engaged with the substrate 2 towards a position in which it is not engaged and outside of the substrate 2 and which is relative to the pressing device 10, tensions the return safety device 22. This movement is driven by the piston 31 of the vacuum cylinder 30. If the vacuum is released, the support device 20 can be driven to an engaged position by the safety device 22. Thus, in case of failure of the vacuum, the end effector 1 can maintain the position of the support device 20 such that the substrate 2 stays clamped. The safety device 22 can have the form of a metal strip. Such a safety device 22 can be fastened to the support device 20 in the middle, particularly of its longitudinal direction, as shown, or at an end, particularly in longitudinal direction, and be in contact to the pressing device 10 at both ends or at one end, preferably of its longitudinal direction.

Further, FIG. 2 shows a vacuum supply line 32 for opening the support device 20.

The guide 15 is connected to the holder 40 at a connection section 41. Preferably, the guide springs 12 are screwed to the holder 40 at the connection section 41.

Figure 3:
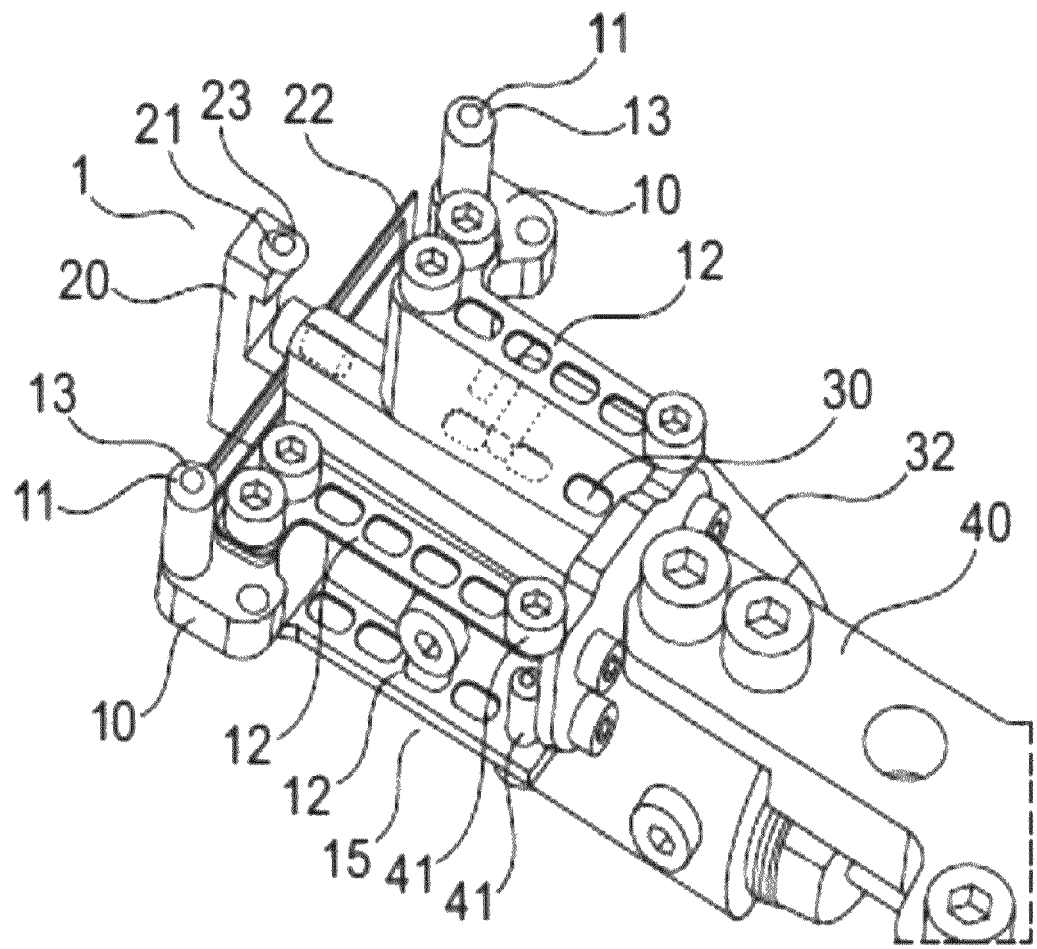
FIG. 3 shows a perspective view in an oblique direction to the lower side of the first embodiment of the end effector without a substrate.

FIG. 3 shows the first embodiment of the end effector 1 in a perspective view obliquely from below and without a substrate. The pressing contact elements 13 with the pressing area 11 are visible.

Figure 4:
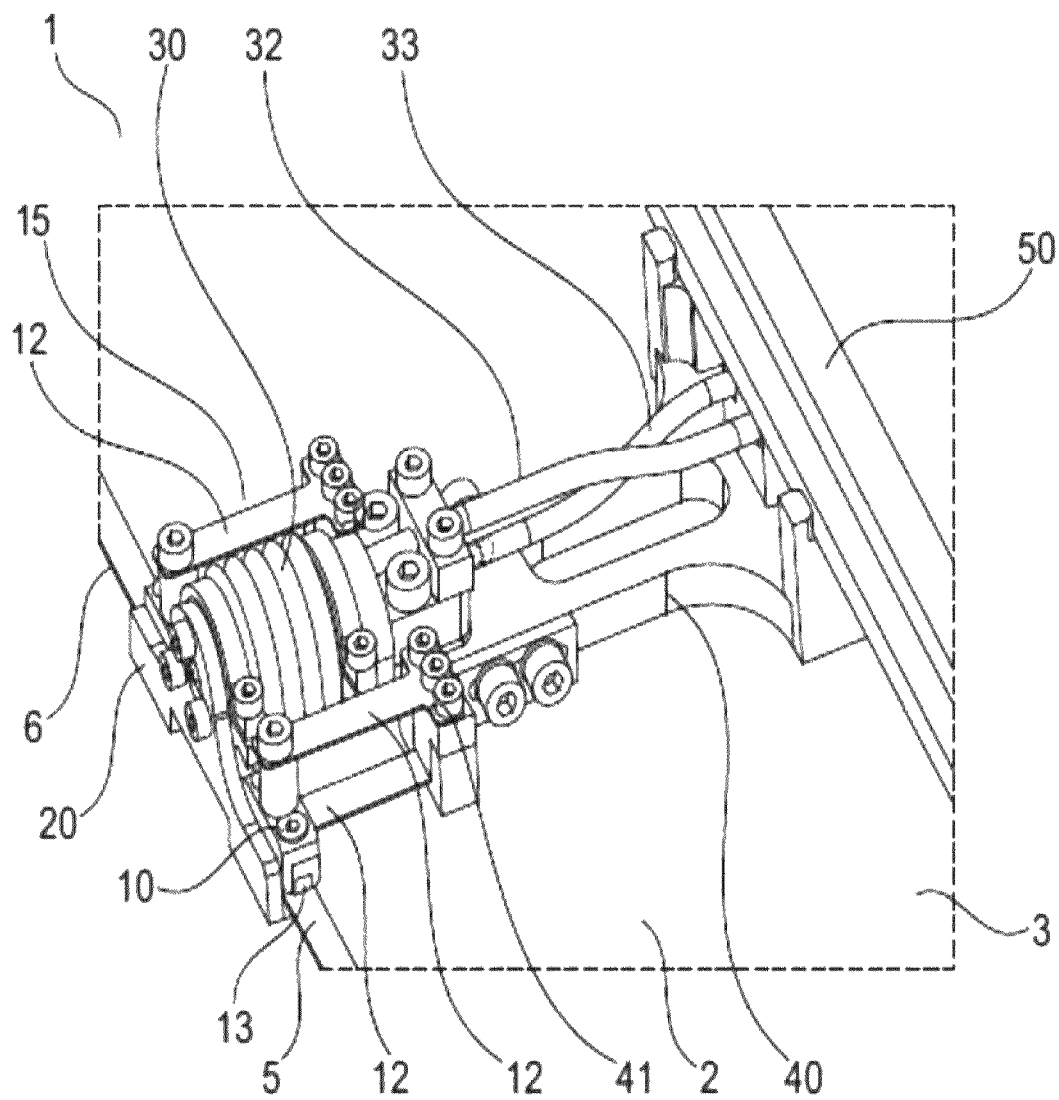
FIG. 4 shows a perspective view in an oblique direction to the other side of a second embodiment of the end effector when clamping a substrate.

FIG. 4 shows a perspective view of the end effector 1 in a second embodiment. In contrast to the first embodiment, the pressing area 11 and the support area 21 are elongated in the second embodiment. The substrate 2 is clamped along a rim section 5 of the substrate 2. The pressing area 11 and the support area 21 extend along the rim section 5 in the clamped state.

In the second embodiment, the end effector 1 comprises a double-acting vacuum cylinder 30. It has a supply line 32 and 33 for each acting direction, respectively.

Further, in FIG. 4, an end effector mount 50 is shown at which the end effector 3 is attached at its holder 40.

Figure 5:
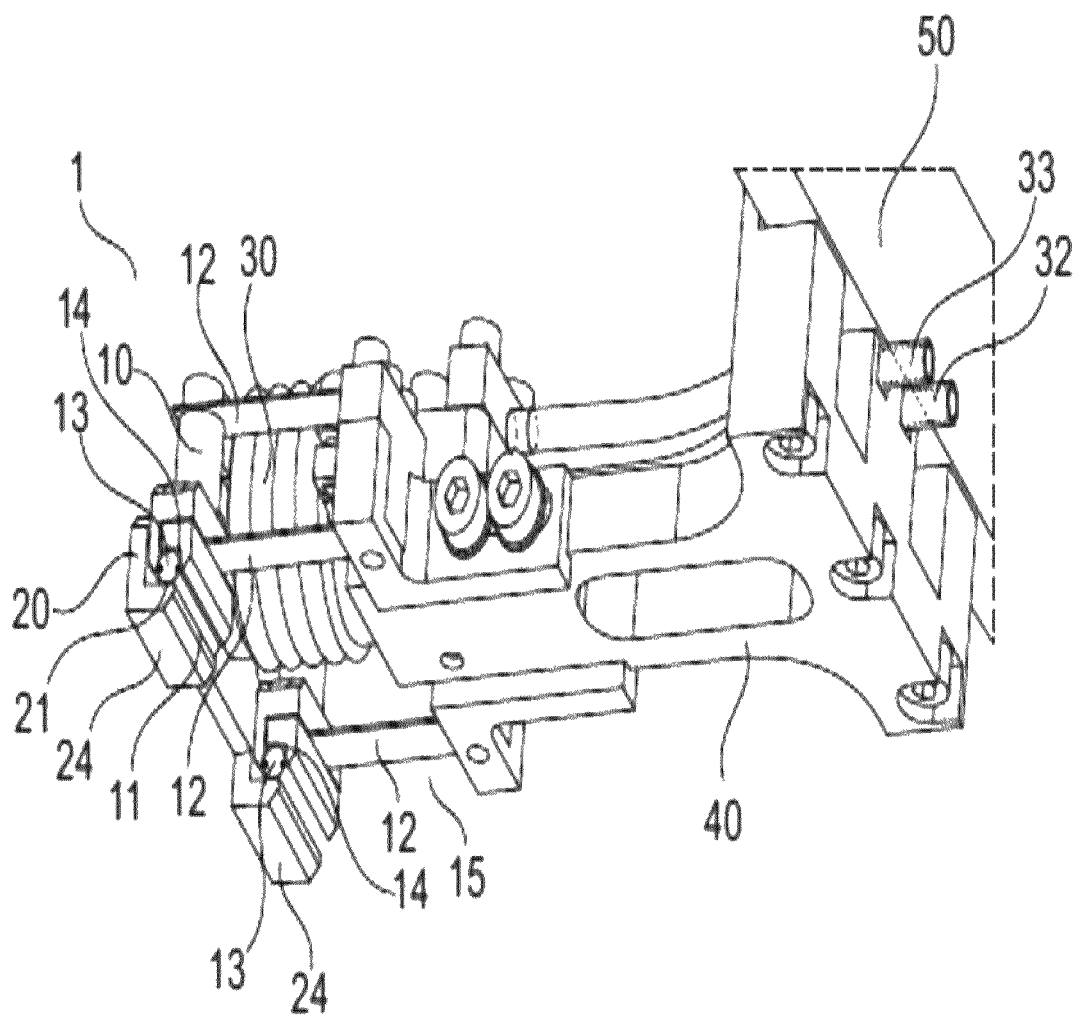
FIG. 5 shows a perspective view in an oblique direction to the lower side of the second embodiment of the end effector without a substrate.

FIG. 5 shows a perspective view of the second embodiment of the end effector 1 from obliquely below and without a substrate. In contrast to the first embodiment, the protrusions 24 are wider. The protrusions 24 each provide a support area 21 which has the same width. The pressing areas 11 of the pressing device 10 are carried out with the same width as the support areas 21. The two pressing areas 11 each are provided by a section of elastomer cord, respectively, which are the pressing contact elements 13. Preferably, their length complies with the width of the protrusions 24. The elongated pressing area 11 and the corresponding elongated support 21 area are adapted to clamp a substrate along a rim section. As shown in FIG. 5, the elastic guide 15 can be preloaded and presses against the support area 21 even without the substrate.

Figure 6:
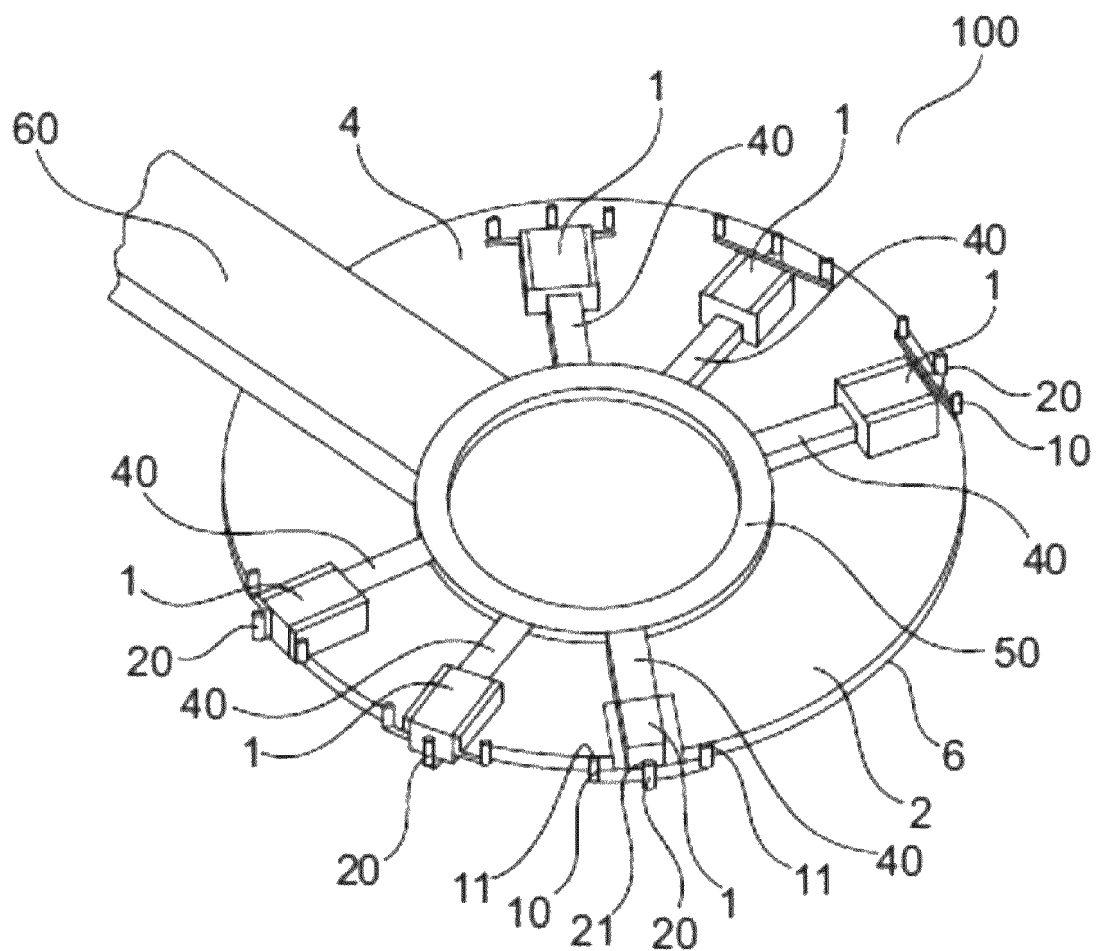
FIG. 6 shows a perspective view in an oblique direction to the underside of a gripping apparatus comprising six end effectors according to the first embodiment when gripping a transparent substrate.

FIG. 6 shows a first embodiment of a gripping apparatus 100 in a perspective view oblique to the underside of the gripping apparatus. The gripping apparatus 100 comprises six end effectors 1 which are shown when gripping a transparent substrate 2. The view is oblique onto the second surface 4 of the substrate 2.

An end effector mount 50 of the gripping apparatus 100 has the form of a ring. At the outer outline of the end effector mount 50, the six end effectors 1 are fastened at their respective holders 40. The gripping apparatus 100 comprises three pairs of end effectors 1 which are arranged at opposite positions in regard of the end effector mount 50. The pairs of end effectors 1 are arranged in an angle to each other. In this way, the substrate 2 can be gripped from different directions such that it has a defined position relative to the gripping apparatus 100. The gripping apparatus 100 comprises a robot adaptor 60 at which the gripping apparatus 100 can be connected to a handling device such as a robot and which is not depicted.

Figure 7:
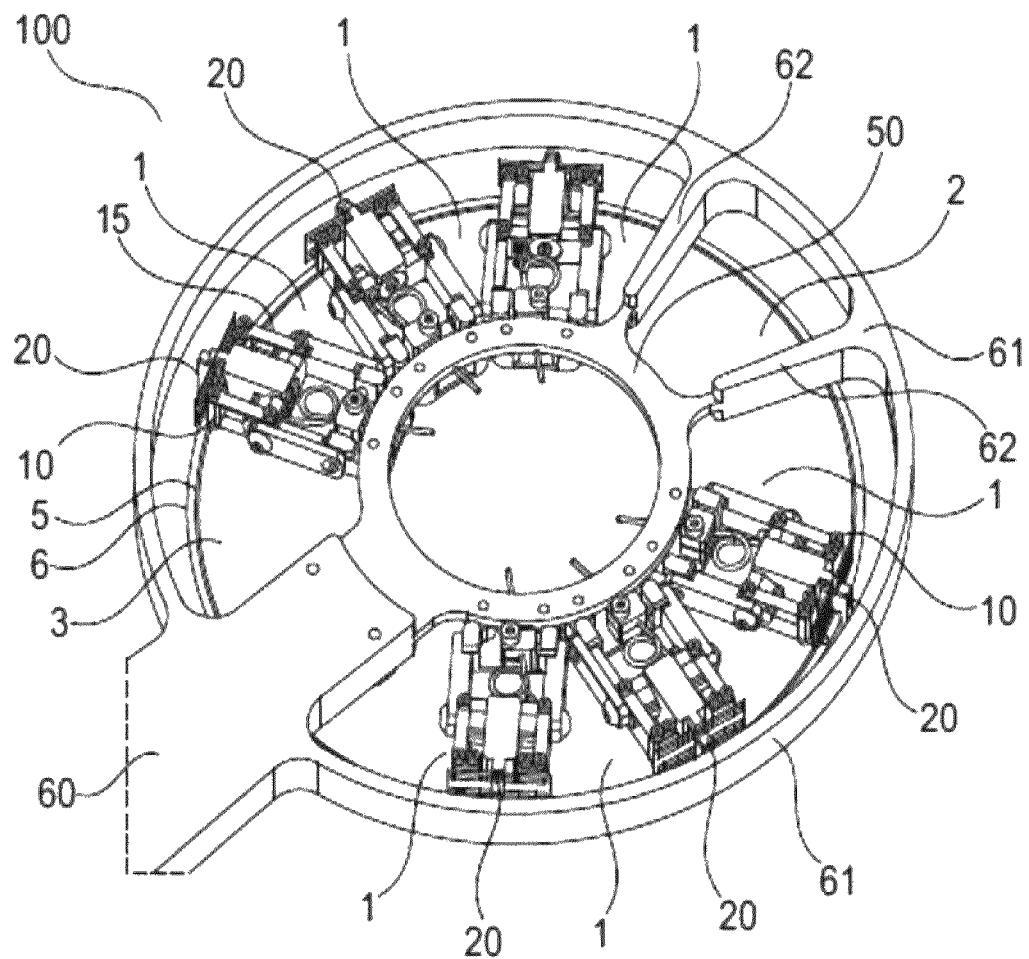
FIG. 7 shows a perspective view in an oblique direction to the upper side of a gripping apparatus comprising six end effectors according to the first embodiment when gripping a substrate.

FIG. 7 shows a second embodiment of a gripping apparatus 100 in a perspective view that comprises six end effectors 1 which grip a substrate 2. The view is oblique onto the first surface of the substrate 2. FIG. 7 shows more details of the gripping apparatus 100 than FIG. 6 and which can also be adopted in the first embodiment.

Additionally to the features of the first embodiment, the second embodiment comprises an adaptor ring 61. The adaptor ring 61 is attached to the robot adaptor 60, and both can be designed to be one single piece. The adaptor ring 61 has two adaptor bars 62 which connect the end effector mount 50 to the adaptor ring 61. The end effector amount 50 is also connected with an extension of the robot adaptor 60. The adaptor ring can protect the end effectors 1 from mechanical damage which might occur when handling a substrate.

While the principles of the invention have been explained in relation to certain particular embodiments, and are provided for purposes of illustration, it is to be understood that various modifications thereof will become apparent to those skilled in the art upon reading the specification. Therefore, it is to be understood that the invention disclosed herein is intended to cover such modifications as fall within the scope of the appended claims. The scope of the invention is limited only by the scope of the appended claims.

REFERENCE SKINS

1 End effector
2 Substrate
3 First surface of the substrate
4 Second surface of the substrate
5 Rim section of the substrate in the substrate main plane
6 Border of the substrate in the substrate main plane
10 Pressing device
11 Pressing area
12 Guiding springs
13 Pressing contact element
14 Groove
15 Guide
20 Support device
21 Support area
22 Safety device
23 Support contact element
24 Support protrusion
30 Actuator
31 Piston
32 Vacuum supply line for opening
33 Vacuum supply line for closing
40 Holder
41 Connection section
50 End effector mount
60 Robot adaptor
61 adaptor ring
62 adaptor bar
100 Gripping apparatus

The invention claimed is:

1. End effector for clamping a slab formed substrate (2) having a rim section (5) that is arranged at least approximately and at least partially in a substrate main plane, wherein the end effector (1) comprises at least:
a pressing device (10) providing at least a pressing area (11);
a support device (20) providing at least a support area (21); and
an actuator (30) arranged to move both the support area (21) and the pressing area (11) in a same direction relative to the substrate, wherein that same direction is parallel to the substrate main plane; and
wherein the end effector (1) is configured, in a clamped state of the substrate (2), to clamp a top of the substrate (2) at a first surface (3) with the pressing area (11) of the pressing device (10) and to clamp a bottom of the substrate at a second surface (4) that is, in regard to the first surface (3), arranged at the opposite side of the substrate (2) with the support area (21) of the support device (20), characterised by a guide (15) for guiding the pressing device (10) relative to the support device (20);
wherein the top of the substrate does not contact the support area, and the bottom of the substrate does not contact the pressing area.

2. End effector according to claim 1, wherein the guide (15) comprises an elastic guide arranged to exert an elastic pressing force on the substrate (2) during a relative movement of the guide (15).

3. End effector according to claim 2, wherein the guide (15) comprises springs (12) as guiding elements.

4. End effector according to claim 1, wherein the support device (20) is movable in a direction parallel to the substrate main plane relative to the pressing device (10) such that the support area (21) of the support device (20) is movable at least partially across a border of the substrate (2) from outside of the substrate (2) into a position behind the substrate (2), as seen from the side of the pressing device (10).

5. End effector according to claim 1, further comprising: an actuator (30) for moving the support device (20).

6. End effector according to claim 5,
wherein the actuator (30) is arranged to move the support device (20) in the direction parallel to the substrate main plane, and
wherein the end effector further comprises
a claw-shaped part comprising a part extending perpendicularly to the substrate main plane and a part (24) extending in parallel to the substrate main plane and connected to the part extending perpendicularly to the substrate main plane,
wherein either the claw-shaped part comprises the actuator and the support device and the actuator is arranged to move the support device relative to the part extending perpendicularly to the substrate main plane or the support device (20) comprises the claw-shaped part.

7. End effector according to claim 5,
wherein the actuator (30) is arranged, in relation to the substrate (2) and in the clamped state of the substrate (1), on the side of the first surface of the substrate (2).

8. End effector according to claim 5, wherein the actuator (30) comprises a vacuum cylinder.

9. End effector according to claim 8, wherein the support device (20) is movable away from the substrate (2) by the effect of vacuum in the vacuum cylinder.

10. End effector according to claim 5, further comprising a safety device (22) by which the support device (20) is movable in the direction parallel to the substrate main plane towards the substrate (2) in case of failure of the actuator (30).

11. End effector according to claim 1, wherein the support device (20) has multiple support areas (21) which have a distance to each other.

12. End effector according to claim 11, wherein at least a part of the support areas (21) is arranged at least approximately in the same plane.

13. End effector according to claim 1, wherein the end effector is configured to clamp a substrate (2) having a thickness of 3 mm or less at a rim section (5) of the substrate (2).

14. End effector according to claim 1, wherein at least one support area (21) and/or at least one pressing area (11) has an elongated form, wherein the longitudinal direction of the support area (21) and/or the pressing area (11) is, in a clamped state of the substrate (2), arranged at least approximately parallel to the rim section (5) of the substrate (2).

15. Gripping apparatus comprising at least one end effector (1) according to claim 1.

16. Gripping apparatus according to claim 15, comprising an end effector holder (50) arranged to hold the at least one end effector (1), wherein the end effector holder (50) is movable relative to the substrate (2) at least partially in a direction that is transverse to the substrate main plane.

17. Gripping apparatus according to claim 16, wherein the end effector holder holds at least two end effectors (1) which are arranged at least approximately at opposite sides of the substrate (2).

18. Gripping apparatus according to claim 17, wherein the end effector holder holds at least three end effectors (1) which are arranged to grip the substrate (2) from different directions.

19. Gripping apparatus according to claim 15, wherein the gripping apparatus is provided with an auxiliary support, and
wherein the gripping apparatus is configured to move the end effector (1) relative to the substrate (2) until a predetermined relative position of the end effector (1) to the auxiliary support is reached.

20. Method for clamping a substrate (2), wherein at least one end effector (1) according to claim 1 is used for clamping the substrate (2), wherein the end effector (1) is moved towards the substrate (2), wherein the pressing device (10) touches the substrate (2) and is moved relative to the support device (20) during the movement of the end effector (1) towards the substrate (2).

21. Method according to claim 20, wherein the movement of the end effector (1) towards the substrate (2) is carried out until a predetermined position is reached in which the support area (21) is arranged, relative to the substrate (2), at the side of the second surface (4) of the substrate (2), wherein, in the predetermined position, the support area (21) is moved across the border (6) of the substrate (2).

22. Method according to claim 21, wherein, after moving the support area (21) across the border (6) of the substrate (2), the end effector (1) is moved away from the substrate (2) until the support area (21) touches the second surface (4) of the substrate (2).

23. Method according to claim 20, wherein, during the movement of the end effector (1) towards the substrate (2), the substrate (2) is supported by an auxiliary support at its second surface (4).

24. End effector for clamping a slab formed substrate (2) having a rim section (5) that is arranged at least approximately and at least partially in a substrate main plane, wherein the end effector (1) comprises at least:
a pressing device (10) providing at least a pressing area (11); and
a support device (20) providing at least a support area (21);
an actuator (30) arranged to move the support device (20) in a direction parallel to the substrate main plane;
wherein the end effector (1) is configured, in a clamped state of the substrate (2), to clamp a top of the substrate (2) at a first surface (3) with only the pressing area (11) of the pressing device (10) and to clamp a bottom of the substrate at a second surface (4) that is, in regard to the first surface (3), arranged at the opposite side of the substrate (2) with only the support area (21) of the support device (20), characterised by a guide (15) for guiding the pressing device (10) relative to the support device (20);
wherein the end effector further comprises a claw-shaped part comprising a part extending perpendicularly to the substrate main plane and a part (24) extending in parallel to the substrate main plane and connected to the part extending perpendicularly to the substrate main plane;
wherein either the claw-shaped part comprises the actuator and the support device and the actuator is arranged to move the support device relative to the part extending perpendicularly to the substrate main plane or the support device (20) comprises the claw-shaped part.

* * * * *